United States Patent
Richter et al.

(10) Patent No.: US 11,693,602 B2
(45) Date of Patent: Jul. 4, 2023

(54) DETECTION OF ILLEGAL COMMANDS

(71) Applicant: Micron Technology, Inc., Boise, ID (US)

(72) Inventors: Michael Dieter Richter, Ottobrunn (DE); Markus Balb, Ottobrunn (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/826,994

(22) Filed: May 27, 2022

(65) Prior Publication Data

US 2022/0365727 A1 Nov. 17, 2022

Related U.S. Application Data

(63) Continuation of application No. 16/719,891, filed on Dec. 18, 2019, now Pat. No. 11,354,064.

(60) Provisional application No. 62/784,927, filed on Dec. 26, 2018.

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 5,703,831 A | 12/1997 | Sawada | |
| 6,075,730 A | 6/2000 | Barth et al. | |
| 6,154,819 A * | 11/2000 | Larsen | G11C 16/22 |
| | | | 711/E12.1 |
| 6,772,352 B1 | 8/2004 | Williams et al. | |
| 6,795,354 B2 | 9/2004 | Cho et al. | |
| 9,317,366 B2 | 4/2016 | Wang | |
| 9,607,714 B2 | 3/2017 | Malladi et al. | |
| 11,113,223 B1 * | 9/2021 | McColgan | G06F 13/4022 |
| 2007/0088974 A1 | 4/2007 | Chandwani et al. | |

(Continued)

OTHER PUBLICATIONS

Korean Patent Office, "Request for the Submission of an Opinion", issued in connection with Korean Patent Application No. 10-2021-7022547 dated Dec. 2, 2022 (12 pages) (6 pages of English translation and 6 pages of Original Document).

(Continued)

*Primary Examiner* — Elias Mamo
(74) *Attorney, Agent, or Firm* — Holland & Hart LLP

(57) ABSTRACT

Methods, systems, and devices for detection of illegal commands are described. A memory device, such as a dynamic random access memory (DRAM), may receive a command from a device, such as a host device, to perform an access operation on at least one memory cell of a memory device. The memory device may determine, using a detection component, that a timing threshold associated with an operation of the memory device would be violated by performing the access operation. The memory device may refrain from executing the access operation based on determining that performing the access operation included in the command would violate the timing threshold. The memory device may transmit, to the device, an indication that performing the command would violate the timing threshold.

20 Claims, 11 Drawing Sheets

(56) References Cited

U.S. PATENT DOCUMENTS

| | | | |
|---|---|---|---|
| 2013/0044553 A1* | 2/2013 | Kwean | G11C 29/023 |
| | | | 365/194 |
| 2014/0181452 A1* | 6/2014 | Malladi | G11C 29/023 |
| | | | 711/167 |
| 2014/0211579 A1 | 7/2014 | Lovelace | |
| 2015/0121133 A1* | 4/2015 | Wang | G06F 11/1016 |
| | | | 714/6.24 |
| 2016/0093344 A1 | 3/2016 | Halbert et al. | |
| 2016/0224011 A1 | 8/2016 | Dykes | |
| 2017/0177240 A1* | 6/2017 | Yu | G06F 3/0653 |
| 2018/0342282 A1 | 11/2018 | Morgan | |

OTHER PUBLICATIONS

Werkmann, H. et al., "GDDR5 training—challenges and solutions for ATE-Based Test", 17th Asian Test Symposium, 2008, pp. 423-428.

International Search Report and Written Opinion received for PCT Patent Application No. PCT/US19/67500, dated Apr. 17, 2020, 10 pages.

* cited by examiner

DETECTION OF ILLEGAL COMMANDS

CROSS REFERENCE

The present Application for Patent is a continuation of U.S. patent application Ser. No. 16/719,891 by Richter, et al., entitled "DETECTION OF ILLEGAL COMMANDS," filed Dec. 18, 2019, which claims priority to U.S. Provisional Patent Application No. 62/784,927 by Richter, et al., entitled "DETECTION OF ILLEGAL COMMANDS," filed Dec. 26, 2018, each of which is assigned to the assignee hereof and each of which is expressly incorporated by reference in its entirety.

BACKGROUND

The following relates generally to a system that includes at least one memory device and more specifically to detection of illegal commands.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

DETAILED DESCRIPTION

Figure 1:
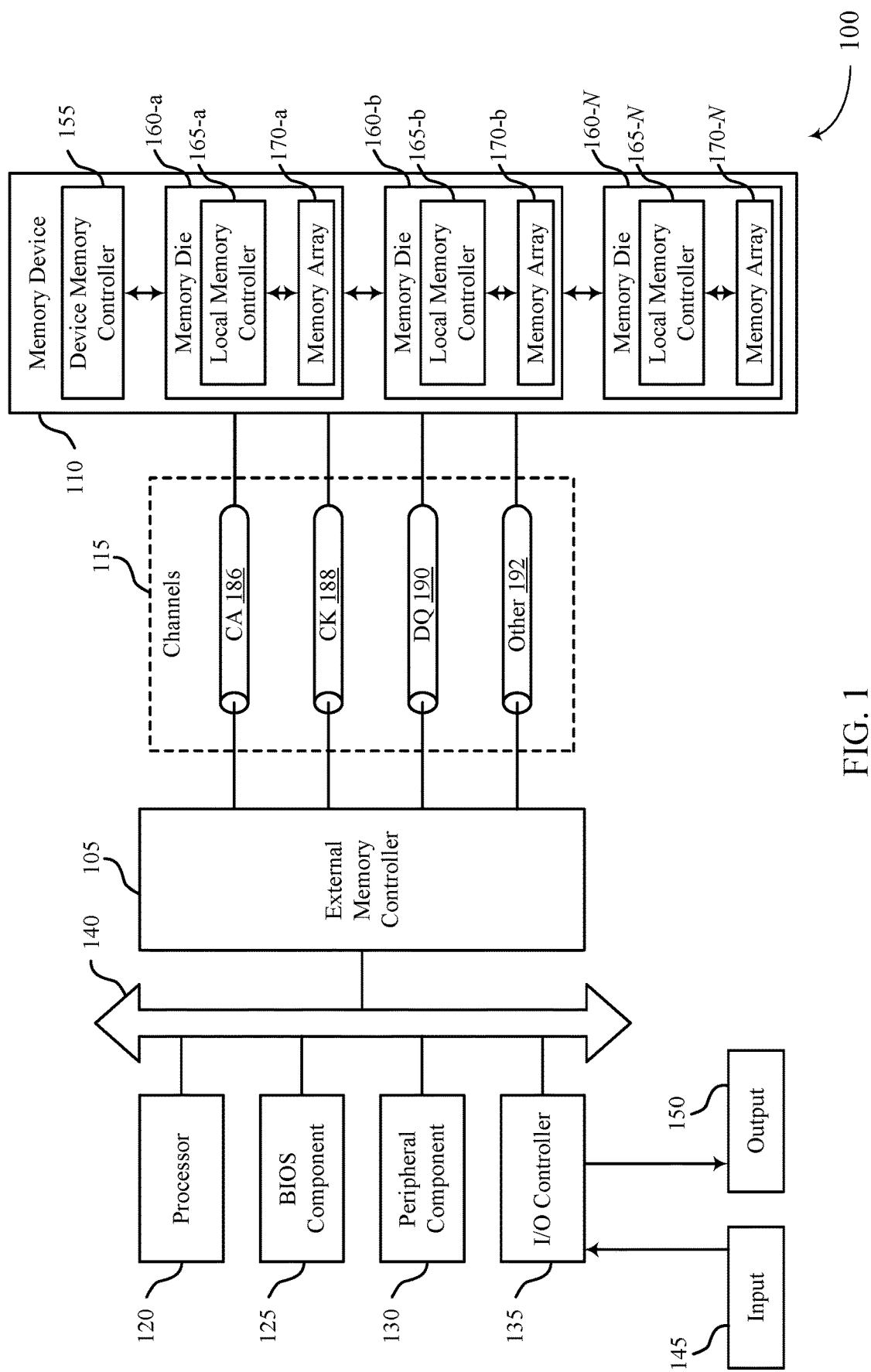
FIG. 1 illustrates an example of a system for operating a memory device that supports detection of illegal commands as disclosed herein.

A memory device, such as a dynamic random access memory (DRAM), may receive a command to perform an operation on one or more memory cells of a memory bank. The command may contain information related to the location (e.g., addresses) of memory banks, rows or columns of memory cells, and/or specific memory cells for which the operation is to be performed.

In some cases, a memory device may receive an illegal or non-valid command. A command may be illegal if, for instance, performing the command may cause one or more of the array timings to be violated. For example, a command may be illegal if the bank, row, column, and/or memory cell indicated by the command are currently engaged in an operation incompatible with the operation being requested by the command (e.g., performing the requested operation may violate a timing of the currently engaged operation).

In one example, an illegal command may direct a read (RD) operation to a memory bank that is not in a state to receive a RD command (e.g., the memory bank is closed, in the process of being closed, or still in the process of being opened), which may result in the host receiving wrong read data. In another example, an illegal command may direct a write (WR) operation to a memory bank that is not in a state to receive a WR command (e.g., the memory bank is closed, in the process of being closed, or still in the process of being opened), which may result in unintentionally overwriting data. In another example, a row activation (ACT) or row precharge (PRE) command may occur at a time where either or both of these operations are illegal (e.g., related timings like a row address strobe time (tRAS), a row precharge time (tRP), and/or a row refresh cycle time (tRFC) have not yet elapsed). Executing such a command may corrupt the data on the entire row. Even if errors (e.g., transmission errors, such as transmission errors on a command/address (C/A) bus, or errors in associated circuits) occur with low probability, the errors may not be tolerable in applications with high security requirements, such as the case of autonomous self-driving cars.

To determine that a command is illegal, a memory device may determine whether the received command violates one or more array timings. For instance, a memory device may decode the command and may determine if an array timing related to the command would be violated if the command is performed. To accomplish this determination, a memory device may use a detection component that contains one or more timers, counters, or a combination thereof. The detection component may select a subset of the one or more timers and/or counters that correspond to the one or more array timings and may check that array timings relevant to the command have elapsed. Additionally or alternatively, a memory device may use a detection component containing a single or multiple processors that perform this process.

The memory device may execute the command if the command is determined to be legal. In some cases, related timers and/or counters may be reset (e.g., to prepare for checking commands that follow) if the command is determined to be legal. If the command is determined to be illegal, the memory device may refrain from executing the command and may report an error to the host (e.g., the memory device may send an error indication to the host). The related timers and/or counters (e.g., for closing open rows in each bank) of the detection component may be selected and each bank of the memory device may be autonomously closed once the timings of these related timers and/or counters are met and the banks may be closed without a risk of losing data content. In some cases, the memory device may enter a locked state after determining that a command is illegal and after completing the previous command currently being executed by the memory device. The memory device may wait to receive an indication (e.g., from the host device) before unlocking and continuing normal operation. In some cases, the memory device may enter a self-refresh mode during the locked state, which may enable the memory device to retain the memory content without any further commands from the host device. Additionally or alternatively, while the memory device is in a locked state, the host device may analyze a root cause of the error condition and/or may prepare corrective actions. In general, the methods disclosed herein may add protections against data loss for memory devices (e.g., memory device) that receive illegal commands. By not executing illegal commands, data stored in memory arrays may have their integrity preserved.

In some cases (e.g., if a host device wishes to determine a duration of one or more timers and/or counters of the detection component of a memory device), a host device may send a training command (e.g., a command that uses existing op-codes but that has at least one otherwise unused C/A bit set differently) to the memory device. The memory device may recognize that the command is a training command and may refrain from entering a locked state. In some cases, the training command may be executed after power-up (e.g., as a part of initialization). Such a training command may enable the host device to determine the latency between sending a command and receiving the error indication from the memory device.

Features of the disclosure are initially described in the context of a memory system as described with reference to FIG. 1. Features of the disclosure are further described below in the context of a memory die, a command validation flow, a detection component circuit, and a training flow as described with reference to FIGS. 2 through 5. These and other features of the disclosure are further illustrated by and described with reference to block diagrams and flowcharts that relate to detection of illegal commands as described with reference to FIGS. 6 through 11.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 or a graphics processing unit (GPU) may be referred to as a host or host device. In some examples, system 100 is a graphics card.

In some cases, a memory device 110 (e.g., a DRAM) may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

In some cases, a host device (e.g., an external memory controller 105) may transmit an illegal command to the memory device 110 (e.g., a DRAM). The memory device 110 may determine that the command is illegal based on determining that executing the command would violate one or more associated array timings. If the memory device 110 determines that the command is illegal, the memory device 110 may refrain from executing the command. Additionally or alternatively, the memory device 110 may provide an error indication or otherwise report an error to the host device.

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI). The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some cases, the device memory controller 155 may contain a detection component circuit which verifies whether or not a command is illegal. The detection component circuit may contain one or more timers and/or counters that check whether associated array timings have elapsed.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. In some cases, local memory controller 165 may contain a detection component circuit which verifies whether or not a command is illegal. The detection component circuit may contain one or more timers and/or counters that check whether associated array timings have elapsed.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include multiple (e.g., eight or nine) signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK t signal and a WCK c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK t signal and a WCK c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

Figure 2:
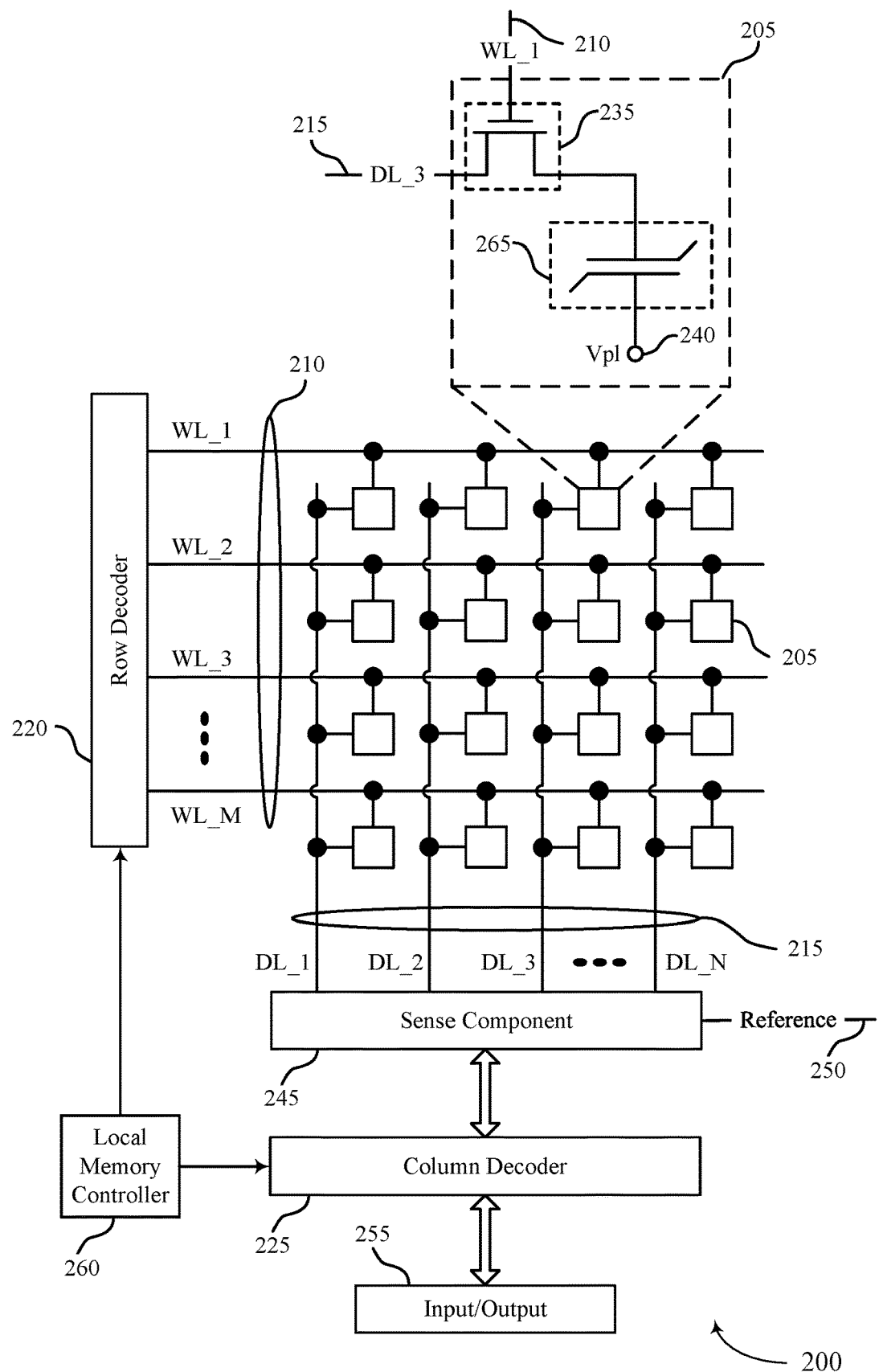
FIG. 2 illustrates an example memory die that supports detection of illegal commands as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a WR operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state. In some cases, performing a WR operation may first involve opening a row of a bank (e.g., at the instruction of an ACT command). A WR command may follow after at least an activate to write time (tRCDWR) after opening the row of the bank. The local memory controller 260 may wait at least a write recovery time (tWR) from the write operation before closing the row of the bank. Additionally or alternatively, the local memory controller 260 may wait at least a tRAS from opening the row of the bank before closing the row of the bank. The local memory controller 260 may close the row of the bank (e.g., at the instruction of a PRE, or precharge, command) and may wait at least a tRP before re-opening the row of the memory bank. A time from opening a row of a bank for a first time to opening a row of the memory bank for a next time may be a row cycle time (tRC), which may equal the sum of tRAS and tRP (e.g., the sum of tRAS and tRP as the minimum).

In some cases, the local memory controller 260 may be configured to perform a RD operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation. In some cases, performing a RD operation may first involve opening a row of a bank (e.g., at the instruction of an ACT command). An RD command may follow at least an activate to read delay time (tRCDRD) after opening the row of the bank. The local memory controller 260 may wait at least a read to precharge time (tRTP) from the read operation before closing the row of the bank. Additionally or alternatively, the local memory controller 260 may wait at least a time tRAS from opening the row of the bank before closing the row of the bank. Upon closing the banks, the local memory controller 260 may close the row (e.g., via a PRE command) and may wait at least a time tRP before re-opening the row of the memory bank. A time from opening a row of a bank for a first time to opening a row of the memory bank for a next time may be a tRC.

An amount of time between a first RD and a subsequent RD operation or a first WR and a subsequent WR may be a column to column delay time (tCCD). An amount of time between an RD and a subsequent WR may be a read to write time (tRTW) and an amount of time between a WR and a subsequent RD may be a write to read time (tWTR).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh (REF) operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or REF operation may be performed on one or more memory cells that may not have been accessed. In some cases, performing a REF operation may involve a single bank or all banks (e.g., if an all-bank refresh to occur) being in idle and/or that at least a time tRP has elapsed since the banks last closed. Upon performing the REF operation, the local memory controller 260 may wait at least a tRFC before opening the memory banks.

Determining that a command (e.g., an ACT, PRE, RD, WR, and/or REF command) is illegal may involve determining that performing the command would violate a group of array timings (e.g., one or more of tRC, tRCDRD, tRCDWR, tRFC, tWR, tRTP, tRP, tRAS, tCCD, tRTW, and tRTW). The group of array timings which are checked may depend on which command is to be performed (e.g., tRCDRD may be checked if the local memory controller 260 would perform a RD operation and tRCDWR if the local memory controller 260 would perform an WR operation).

Figure 3:
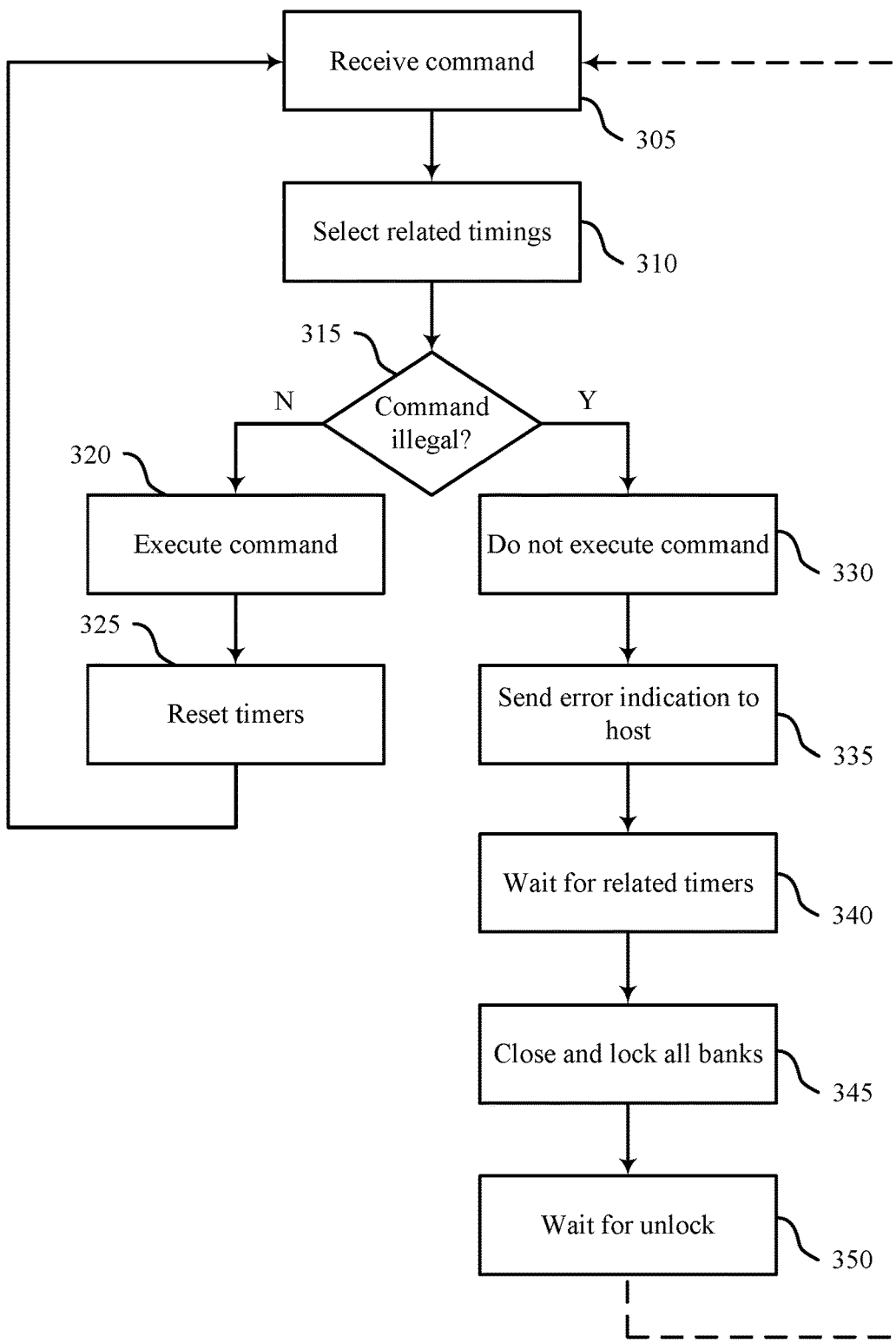
FIG. 3 illustrates an example of a command validation flow that supports detection of illegal commands in accordance with aspects as disclosed herein.

FIG. 3 illustrates an example of a command validation flow 300 that supports detection of illegal commands in accordance with aspects as disclosed herein. In some examples, command validation flow 300 may be implemented by aspects of a system 100 and/or memory die 200 as described herein. For instance, command validation flow 300 may be implemented by a host device (e.g., an external memory controller 105) or a memory device 110 (e.g., a DRAM), or a combination thereof, as described with reference to FIGS. 1 and 2.

At 305, a memory device 110 may receive a command from a host device (e.g., an external memory controller 105). More specifically, device memory controller 155 and/or a local memory controller 165 (e.g., the local memory controller 165 associated with the memory die 160 whose row the command is pointing to) may receive the command. Examples of the command received from the host device may include an activation command, a precharge command, a write command, a read command, or a refresh command, or a combination thereof.

At 310, the memory device 110 may select one or more timers and/or counters that include one or more respective timing parameters (e.g., array timings) associated with executing the received command by the memory device. In some cases, the timers may be examples of analog components and may be calibrated or programmed to a respective array timing. In some cases, the counters may be examples of digital components (such as a binary counter) and may be programmed to count, at a given clock frequency, a quantity of clock cycles associated with performing the received command. Each timer and/or counter may be programmed as part of an executed DRAM configuration procedure (e.g., executed at power-up or when there is a change in operating frequency). In some cases, the memory device 110 may use a processor that contains the respective array timings instead of timers and/or counters. Each timer, counter, and/or processor may be configured to track tRC, tRAS, tRP, tRFC, tRCDRD, tRCDWR, tRTP, tWR, tCCD, tRTW, tWTR, or a combination of these. Some of the timers and/or counters may be present per bank (e.g. tRAS, tRP), and other timers and/or may be present once per device or once per group of banks (e.g. tRFC, tCCD).

At 315, the memory device 110 may determine whether the received command is illegal. If the memory device 110 determines that the received command is legal, the memory device 110 may execute the command as shown at 320. If the memory device determines that the received command is illegal, the memory device 110 may execute the operations illustrated at 330. Determining whether the received command is illegal may involve using a detection component (e.g., external or internal to memory device 110) to determine what operation the received command is associated with (e.g., via decoding and/or parsing); if one or more timing thresholds relevant to the command have been met; a bank state of one or more memory banks to which a command is pointing; or a combination of these. Determining whether the command is illegal may involve using one or more analog timers and/or analog counters or may be performed by a processor.

In one example, the detection component may determine that an ACT command has been received. The detection component may flag an error if a row in a bank to which the ACT command is pointing is already open; the bank is in the process of precharging; tRP has not elapsed; tRFC (e.g., from a preceding REF command) has not elapsed; or a combination thereof.

In another example, the detection component may determine that a PRE command has been received. The detection component may flag an error if a row in a bank to which the PRE command is pointing is already open; tRAS has not elapsed; tWR has not elapsed; tRTP has not elapsed; or a combination thereof.

In another example, the detection component may determine that a WR command has been received. The detection component may flag an error if a bank to which the WR command is pointing is idle or in the process of precharging; a row of that bank is open and tRCDWR has not elapsed; tCCD (e.g., from a preceding WR command) has not elapsed; tRTW (e.g., from a preceding RD command) has not elapsed; tRP has not elapsed; or a combination thereof.

In another example, the detection component may determine that an RD command has been received. The detection component may flag an error if a bank to which the RD command is pointing is idle or in the process of precharging; a row of that bank is open and tRCDRD has not elapsed; tCCD (e.g., from a preceding RD command) has not elapsed; tWTR (e.g., from a previous WR command) has not elapsed; tRP has not elapsed; or a combination thereof.

In another example, the detection component may determine that a REF command has been received. The detection component may flag an error if a row of a bank to which the REF command is pointing is open; any banks are in the process of precharging; tRP has not elapsed; tRAS has not elapsed; tRFC has not elapsed; or a combination thereof. Additionally or alternatively, all banks may be checked and the detection component may flag an error if any rows of any bank are open; any banks are in the process of precharging; tRP has not elapsed for every bank; tRAS has not elapsed for every bank; tRFC has not elapsed for every bank; or a combination thereof.

At 320, the memory device 110 may determine to execute the received command. In some cases, the command may be executed by a processor, controller, or dedicated logic, or a combination thereof.

At 325, the memory device 110 may reset timers and/or counters that may relate to array timings associated with the command, if any, of the detection component. The memory device 110 may reset all timers and/or counters of the detection component or may reset the timers and/or counters selected by the memory device 110. After 325, the memory device 110 may continue normal operation (e.g., the memory device 110 may perform 110). The memory device 110 may skip resetting the timers if procedures described herein are performed by a processor.

At 330, the memory device 110 may refrain from executing the command. In some cases, refraining from executing the command may be performed by a processor.

At 335, the memory device 110 may transmit an error indication or otherwise report an error to the host device. For instance, the memory device 110 may contain a set of error pins that connect to an interrupt input of the host device. Additionally or alternatively, one or more output pins (e.g., an EDC pin) of the memory device 110 may signal an error to the host device by stop toggling and driving a fixed high (H) or low (L) level. Additionally or alternatively, one or more output pins of the memory device 110 that typically drive a known pattern (e.g., checksum) may drive the known pattern inverted, which the host device may detect as an indication of an illegal command. The error reporting may be cycle accurate (e.g., the duration from receiving a command to reporting the error may be a known value), which may enable the host device to identify exactly which command failed. The delay may be a fixed quantity of clock cycles or may vary (e.g., the host device may dynamically or otherwise program the delay into an internal register of the memory device 110). In some cases, the operations of 330 and 335 may be switched (e.g., 335 may be performed before, subsequently with, or after 330).

At 340, the memory device 110 may wait for all or a subset of one or more timers and/or counters (e.g., the one or more timers and/or counters selected by the memory device 110) to meet their respective timing thresholds. For example, the memory device 110 may wait for a current command being executed by the memory device to complete. Once the current command is complete, the memory device may move on to other functions.

At 345, the memory device 110 may close all or some memory banks of the memory device 110, and the memory device 110 may enter a locked state. The locked state may prevent other commands from being performed on the memory banks of the memory device. The memory device 110 may enter self-refresh mode during the locked state, which may preserve memory content.

At 350, the memory device 110 may wait until it receives an indication (e.g., from the host device) to unlock. Once the memory device 110 is unlocked, the memory device 110 may perform new commands (e.g., the memory device may perform 305).

Figure 4:
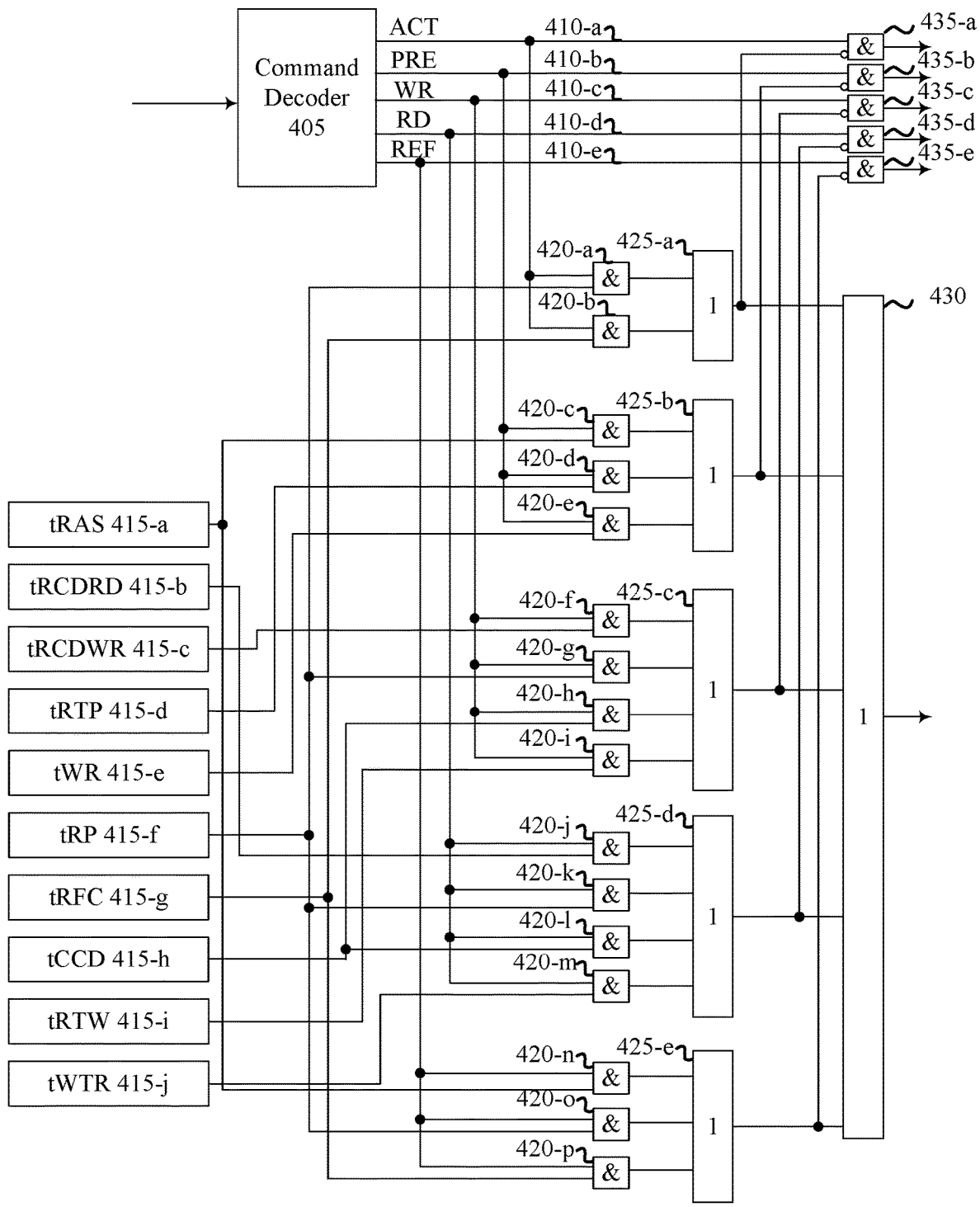
FIG. 4 illustrates an example of a detection component circuit that supports detection of illegal commands in accordance with aspects as disclosed herein.

FIG. 4 illustrates an example of a detection component circuit 400 that supports detection of illegal commands in accordance with aspects as disclosed herein. In some examples, detection component circuit 400 may implement aspects of system 100 and/or memory die 200 as described herein. All functions of the components of FIG. 4 may be performed by a processor.

A command decoder 405 may receive a command (e.g., sent from the host device) via one or more command pins. The command decoder 405 may decode and/or parse the command and may output a logic value (e.g., a logical low or a logical high) along at least one command line 410. The command decoder may determine which line to output the logic value on based on an operation that the command is associated with. For instance, the command decoder may output a logical high (e.g., 1) on the command line 410-*a* if the command is an ACT command; a logical high (e.g., 1) on command line 410-*b* if the command is a PRE command; a logical high (e.g., 1) on command line 410-*c* if the command is a WR command; a logical high (e.g., 1) on command line 410-*d* if the command is a RD command; and a logical high (e.g., 1) on command line 410-*e* if the command is a REF command. In some cases, any of these command lines 410 may be omitted. In some cases, these individual commands may be transmitted across a common command line.

Detection component circuit 400 may include one or more timing components 415. The timing components 415 may be timers (e.g., analog timers), counters (e.g., digital counters), or any other device which may be used for timing. Each timing component 415 may check a different array timing. For instance, timing component 415-*a* may check if tRAS has elapsed; timing component 415-*b* may check if tRCDRD has elapsed; timing component 415-*c* may check if tRCDWR has elapsed; timing component 415-*d* may check if tRTP has elapsed; timing component 415-*e* may check if tWR has elapsed; timing component 415-*f* may check if tRP has elapsed; timing component 415-*g* may check if tRFC has elapsed; timing component 415-*h* may check if tCCD has elapsed; timing component 415-*i* may check if tRTW has elapsed; and timing component 415-*j* may check if tWTR has elapsed. Additionally or alternatively, there may be a timing component 415 checking if tRC has elapsed. The output of each timing component 415 may be a logical high (e.g., 1) if the related timing has not elapsed and may be a logical low (e.g., 0) when the timing has elapsed. Any of the timing components 415 may be omitted.

Detection component circuit 400 may compare an output of the command decoder 405 (e.g., via command lines 410) with one or more output of timing components 415 (e.g., via timing component output lines). Comparing may, for instance, include passing an output of the command decoder 405 and an output of a timing component 415 through an AND component 420 (e.g., an AND gate) for each timing of the one or more timings associated with the received command. In some cases, comparing the output via an AND component 420 may enable the command signal to select corresponding timing parameters (tRAS, tRP, etc.). The outputs of each AND component 420 of the command may be input into an OR component 425 (e.g., an OR gate), which may output an indication that the timing is violated (e.g., a logical high) if the related command is active and the one or more of the related timings has not yet elapsed (e.g., if at least one of the related AND components 420 outputs a logical high). Elsewise, the OR component 425 may indicate that the timing is not violated (e.g., the OR component 425 may output a logical low). In some cases, other logic components (e.g., a combination of NOTs, ANDs, and ORs) may be used. Additionally or alternatively, AND components 420 may be omitted completely and each OR component 425 may receive outputs of command decoder 405 and/or timing components 415 directly.

Command line 410-*a* (e.g., the command line 410 associated with an ACT command) may be coupled with AND components 420-*a* and/or 420-*b*. Additionally, timing component 415-*f* (e.g., the timing component 415 that checks tRP) may be coupled with AND component 420-*a* and/or timing component 415-*g* (e.g., the timing component 415 that checks tRFC) may be coupled with AND component 420-*b*. The outputs of AND components 420-*a* and/or 420-*b* may be coupled with OR component 425-*a*. In some cases, one or more additional AND components 420 and connections to corresponding timing components 415 (e.g., the other timing components 415 illustrated in FIG. 4), command line 410-*a*, and OR component 425-*a* may be added.

Command line 410-*b* (e.g., the command line 410 associated with a PRE command) may be coupled with AND components 420-*c*, 420-*d*, 420-*e*, or a combination. Additionally, timing component 415-*a* (e.g., the timing component 415 that checks tRAS) may be coupled with AND component 420-*c*; timing component 415-*d* may be coupled with AND component 420-*d* (e.g., the timing component 415 that checks tRTP); timing component 415-*e* (e.g., the timing component 415 that checks tWR) may be coupled with AND component 420-*e*; or a combination of these scenarios may occur. The outputs of AND components 420-*c*, 420-*d*, 420-*e* or a combination may be coupled with OR component 425-*b*. In some cases, one or more additional AND components 420 and connections to the corresponding timing components 415 (e.g., the other timing components 415 illustrated in FIG. 4), command line 410-*b*, and OR component 425-*b* may be added.

Command line 410-*c* (e.g., the command line 410 associated with a WR command) may be coupled with AND components 420-*f*, 420-*g*, 420-*h*, 420-*i*, or a combination. Additionally, timing component 415-*c* (e.g., the timing component 415 that checks tRCDWR) may be coupled with AND component 420-*f*; timing component 415-*f* (e.g., the timing component 415 that checks tRP) may be coupled with AND component 420-*g*; timing component 415-*h* (e.g., the timing component 415 that checks tCCD) may be coupled with AND component 420-*h*; timing component 415-*i* (e.g., the timing component 415 that checks tRTW) may be coupled with AND component 420-*i*; or a combination of these scenarios may occur. The outputs of AND components 420-*f*, 420-*g*, 420-*h*, 420-*i*, or a combination may be coupled with OR component 425-*c*. In some cases, one or more additional AND components 420 and connections to the corresponding timing components 415 (e.g., the other timing components 415 illustrated in FIG. 4), command line 410-*c*, and OR component 425-*c* may be added.

Command line 410-*d* (e.g., the command line 410 associated with an RD command) may be coupled with AND components 420-*j*, 420-*k*, 420-*l*, 420-*m*, or a combination. Additionally, timing component 415-*b* (e.g., the timing component 415 that checks tRCDRD) may be coupled with AND component 420-*j*; timing component 415-*f* (e.g., the timing component 415 that checks tRP) may be coupled with AND component 420-*k*; timing component 415-*h* (e.g., the timing component 415 that checks tCCD) may be coupled with AND component 420-*l*; timing component 415-*j* (e.g., the timing component 415 that checks tWTR) may be coupled with AND component 420-*m*; or a combination of these scenarios may occur. The outputs of AND components 420-*j*, 420-*k*, 420-*l*, 420-*m*, or a combination may be coupled with OR component 425-*d*. In some cases, one or more additional AND components 420 and connections to the corresponding timing components 415 (e.g., the other timing components 415 illustrated in FIG. 4), command line 410-*d*, and OR component 425-*d* may be added.

Command line 410-*e* (e.g., the command line associated with a REF command) may be coupled with AND components 420-*n*, 420-*o*, 420-*p*, or a combination. Additionally, timing component 415-*a* (e.g., the timing component 415 that checks tRAS) may be coupled with AND component 420-*n*; timing component 415-*f* (e.g., the timing component 415 that checks tRP) may be coupled with AND component 420-*o*; timing component 415-*g* (e.g., the timing component 415 that checks tRFC) may be coupled with AND component 420-*p*; or a combination of these scenarios may occur. The outputs of AND components 420-*n*, 420-*o*, 420-*p* or a combination may be coupled with OR component 425-*e*. In some cases, one or more additional AND components 420 and connections to the corresponding timing components 415 (e.g., the other timing components 415 illustrated in FIG. 4), command line 410-*e*, and OR component 425-*e* may be added.

OR components 425-*a*, 425-*b*, 425-*c*, 425-*d*, 425-*e*, or a combination may be coupled with OR component 430. OR component 430 may output an error indication (e.g., a logical high) if at least one of the OR components 425 outputs a logical high. In some cases, OR components 425-*a*, 425-*b*, 425-*c*, 425-*d*, 425-*e*, or a combination may alternatively be coupled with one or more other logic components (e.g., components that perform NOT, AND, and/or OR operations) that may output the error indication.

Detection component circuit 400 may compare a complement of an output of each OR component 425 (e.g., the output of the OR component 425 passed through a NOT component, such as a NOT gate) with a corresponding output of command decoder 405 (e.g., via command line 410). Comparing may, for instance, include passing an output of the command decoder 405 and a complement of an output of a corresponding OR component 425 through an AND component 435 (e.g., an output along command line 410-*a* and a complement of the output of OR component 425-*a*, which may be associated with command line 410-*a*, may be compared by AND component 435-*a*). After the outputs are compared, the AND component 435 may output an indication of whether to execute a command (e.g., a logical high may mean the command is to be executed and a logical low may mean the command is not to be executed). In some cases, AND components 435 may be omitted completely and the complement of outputs of each OR component 425 and/or the output of the command decoder 405 may be output directly.

In some cases, the detection component 400 may include one or more components that form a selection component configured to select the timing threshold from a set of timing thresholds based at least in part on a type of the command received from the host device. Not every command received from the host device will implicate every array timing. As such, the detection component 400 (e.g., using a selection component) may identify or select the array timings associated with a given command. In some cases, the selection component may include analog components and the routing may be hardwired into those components. As shown in FIG. 4. In some cases, the selection component may be executed by digital components (including hardware, firmware, or software) to select array timings associated with the received command.

Figure 5:
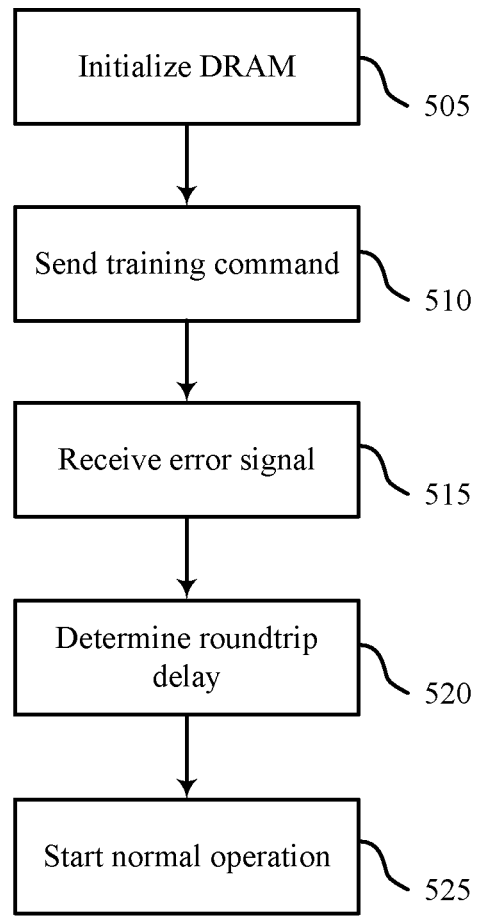
FIG. 5 illustrates an example of a training flow that supports detection of illegal commands in accordance with aspects as disclosed herein.

FIG. 5 illustrates an example of a training flow 500 that supports detection of illegal commands in accordance with aspects as disclosed herein. In some examples, training flow 500 may be implemented by aspects of system 100 and/or memory die 200 as described herein.

At 505, a host device (e.g., external memory controller 105) may initialize a memory device 110 (e.g., DRAM).

At 510, the host device may transmit a training command to the memory device 110. The training command may be a special training command that the memory device 110 recognizes as such. The training command may be configured to indicate to the memory device that timings associated with error indications will be determined. For example, when a memory device detects that command is illegal and sends an indication of the error back to the host device, there may be some delay between when the host device transmits the command and when the host device receives the indication. Such a delay may be measured in clock cycles or in a unit of seconds (e.g., nanoseconds). That delay may make it difficult for the host device to determine which command was illegal and, thus, may make it difficult for the host device to re-send the command that included an error. One purpose of the training procedure may be to identify the delay (e.g., a command-to-indication delay) between transmitting a command and receiving an error indication. Such a delay may be used by the host device, to identify the command that was illegal. When performing the training operation, the memory device 110 may not enter a locked state upon detecting an error.

At 515, the host device may receive an error signal from the memory device 110. For instance, the memory device 110 may receive the special training command and may set and transmit an error flag with the same timing as if a normal training command was received. The memory device 110 may contain a set of error pins that connect to an interrupt input of the host device. Additionally or alternatively, one or more output pins (e.g., an EDC pin) of the memory device 110 may signal an error to the host device by stop toggling and driving a fixed logical high or logical low level. Additionally or alternatively, one or more output pins of the memory device 110 that typically drive a known pattern (e.g., checksum) may drive the known pattern inverted, which the host device may detect as an indication of an illegal command.

At 520, the host device may determine and store a round-trip delay (e.g., a command-to-indication delay). A round-trip delay may, for instance, be a quantity of clock cycles in between sending the training command and receiving the error signal. Determining the round-trip delay may enable the host device to determine which command has failed. This may result from the error reporting being cycle accurate (e.g., from having a duration from receiving a command to reporting the error at a known value).

At 525, the host device may begin normal operation (e.g., operation that occurs after initialization) based on determining the round-trip delay. The round-trip delay may be used by the host device to determine which command was illegal after receiving an error indication.

Figure 6:
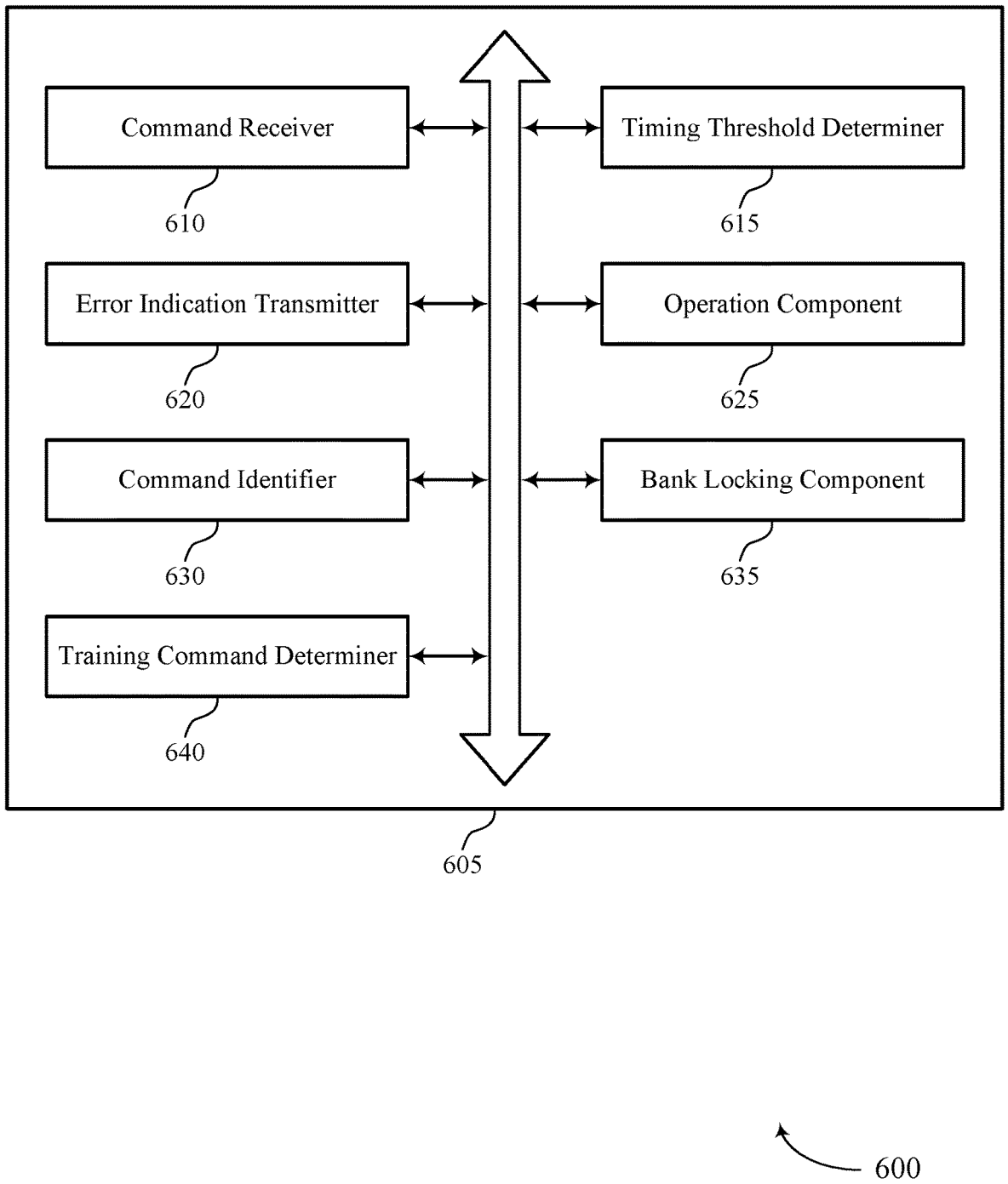
FIG. 6 shows a block diagram of a device that supports detection of illegal commands in accordance with aspects as disclosed herein.

FIG. 6 shows a block diagram 600 of a controller 605 that supports detection of illegal commands in accordance with aspects as disclosed herein. The controller 605 may be an example of aspects of a detection component, a device memory controller 155, or a local memory controller 165, or a combination thereof as described with reference to FIGS. 1, 2, and 4. The controller 605 may include a command receiver 610, a timing threshold determiner 615, an error indication transmitter 620, an operation component 625, a command identifier 630, a bank locking component 635, a training command determiner 640, and an error indication receiver 645. Each of these modules may communicate, directly or indirectly, with one another (e.g., via one or more buses).

The command receiver 610 may receive, from a host device, a command to perform an access operation on a memory cell of a memory device. In some examples, the command receiver 610 may receive, from a host device, a command to perform an access operation on at least one memory cell of the bank. In some cases, the memory device includes a bank having one or more rows of memory cells, where at least one of the one or more rows includes the memory cell. In some cases, the command includes a row activation command, a row precharge command, a write command, a read command, or a refresh command, or any combination thereof. In some cases, the memory device includes a DRAM memory device.

The timing threshold determiner 615 may determine, using a detection component of the memory device, that a timing threshold associated with an operation of the memory device would be violated by performing the access operation. In some examples, the timing threshold determiner 615 may determine that a timing threshold associated with accessing the at least one memory cell would be violated by performing the access operation. In some examples, the timing threshold determiner 615 may select the timing threshold from a set of timing thresholds based on the command, where determining whether the timing threshold would be violated is based on selecting the timing threshold. In some examples, selecting a set of timing thresholds from the set of timing thresholds based on the command, where determining whether the timing threshold would be violated includes determining whether at least one of the set of timing thresholds would be violated. In some examples, the timing threshold determiner 615 may identify a state of a bank associated with the memory cell based on receiving the command, where transmitting the indication to the host device is based on the state of the bank when the command is received. In some examples, the timing threshold determiner 615 may determine that a row of a bank of the memory device is open, the bank is precharging, a tRP has not elapsed, or a tRFC associated with a refresh command has not elapsed, or any combination thereof. In some examples, the timing threshold determiner 615 may determine that no row of a bank of the memory device is open, a row of the bank is open and a tRAS has not elapsed, a tWR associated with a write command has not elapsed, a tRTP associated with a read command has not elapsed, or any combination thereof. In some examples, the timing threshold determiner 615 may determine that a bank of the memory device is idle or precharging, a row of the bank is open and an tRCDWR has not elapsed, a tCCD associated with a preceding write command has not elapsed, a tRTW associated with a preceding read command has not elapsed, or any combination thereof. In some examples, the timing threshold determiner 615 may determine that a bank of the memory device of the is idle or precharging, the bank is open and a tRCDRD has not elapsed, a tCCD associated with a preceding read command has not elapsed, a tWTR associated with a preceding write command has not elapsed, or any combination thereof. In some examples, the timing threshold determiner 615 may determine that a row of a bank of the memory device is open, the bank is precharging, a tRP has not elapsed, or any combination thereof. In some cases, the timing threshold includes a tRC, a tRAS, a tRCDRD, a tRCDWR, a tRTP, a tWR, a tRP, a tRFC, a tCCD, a tRTW, a tWTR, or any combination thereof.

The error indication transmitter 620 may transmit, to the host device, an indication that performing the command by the memory device would violate the timing threshold based on determining that the timing threshold would be violated. The error indication transmitter 620 may transmit, to the host device, an error signal indicating that the command received from the host device cannot be performed by the memory device based on determining that the timing threshold would be violated.

The operation component 625 may refrain from executing the access operation based on determining that the timing threshold would be violated using the detection component, where transmitting the indication is based on refraining from executing the access operation. In some examples, the operation component 625 may refrain from executing the access operation based on determining that the timing threshold would be violated using the detection component, where transmitting the indication occurs after refraining from executing the access operation.

The command identifier 630 may identify the command received from the host device after receiving the command.

The bank locking component 635 may lock a bank associated with the memory cell and/or memory device to prevent additional operations being performed on the bank based on determining that the timing threshold would be violated, where the indication indicates that the bank is locked. In some examples, the bank locking component 635 may identify that the memory device has completed a current access operation, where locking the bank occurs after the current access operation is complete. In some examples, the bank locking component 635 may receive, from the host device, a message that includes information configured to unlock the bank to enable an additional operation to be performed on the bank based on transmitting the indication.

The training command determiner 640 may determine that the command is a training command, where receiving the command occurs during initialization of the memory device.

Figure 7:
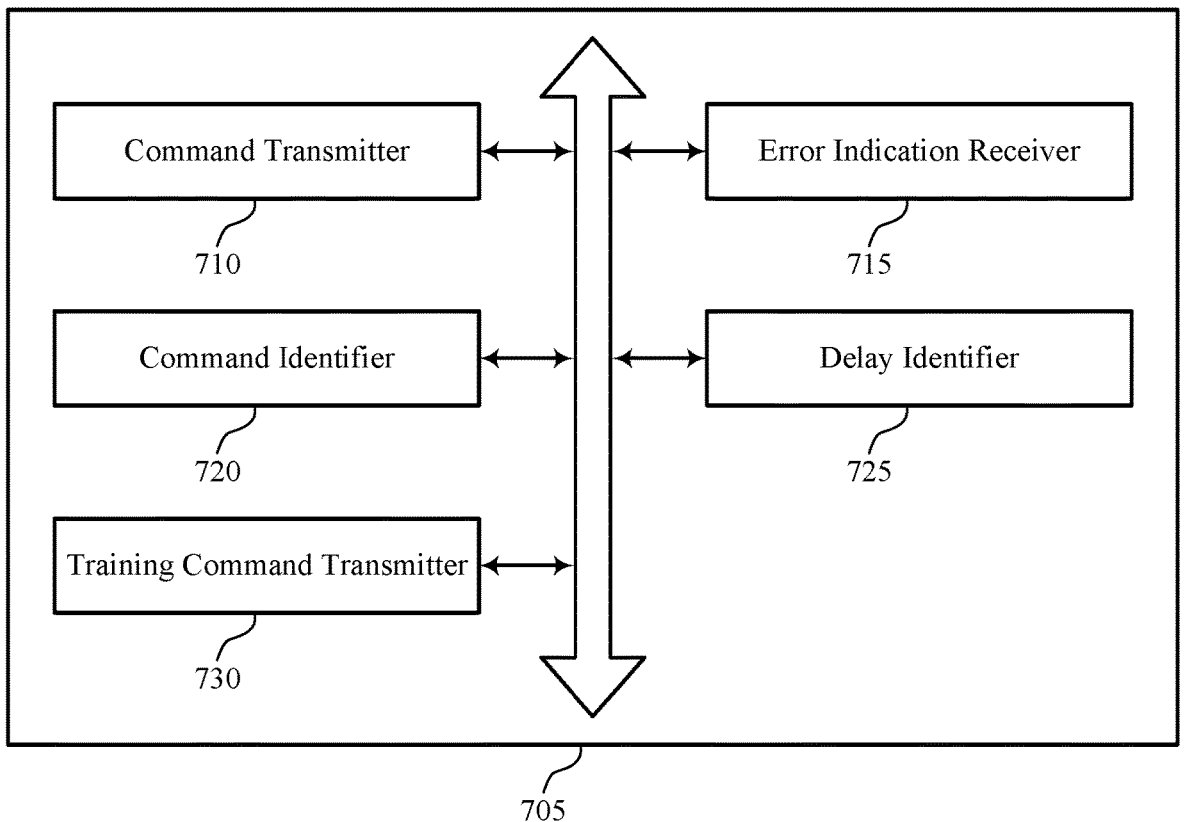
FIG. 7 shows a block diagram of a device that supports detection of illegal commands in accordance with aspects as disclosed herein.

FIG. 7 shows a block diagram 700 of a device 705 that supports detection of illegal commands in accordance with aspects as disclosed herein. The device 705 may be an example of aspects of a host device (e.g., an external memory controller 105) as described with reference to FIG. 1. The device 705 may include a command transmitter 710, an error indication receiver 715, a command identifier 720, a delay identifier 725, and a training command transmitter 730. Each of these modules may communicate, directly or indirectly, with one another (e.g., via one or more buses).

The command transmitter 710 may transmit, from a host device, a command to perform an access operation on a memory cell of a memory device. In some examples, the command transmitter 710 may re-send, by the host device, the command to the memory device based on receiving the indication.

The error indication receiver 715 may receive, by the host device, an indication that performing the command by the memory device would violate a timing threshold associated with an operation of the memory device based on determining that the timing threshold would be violated. In some examples, the error indication receiver 715 may receive, from the memory device, an error signal based on transmitting the training command.

The command identifier 720 may identify the command from a set of commands sent from the host device that would violate the timing threshold based on receiving the indication.

The delay identifier 725 may identify a command-to-indication delay associated with a duration between when the host device transmits the command and receives the indication, where identifying the command associated with the indication is based on identifying the command-to-indication delay. In some examples, the delay identifier 725 may identify a command-to-indication delay associated with a duration between when the host device transmits the command and receives the indication based at least in part a difference between a first time that the training command is transmitted and a second time the error signal is received, where identifying the command associated with the indication is based on identifying the command-to-indication delay. In some examples, the delay identifier 725 may store the command-to-error delay to use when identifying the command associated with the indication.

The training command transmitter 730 may transmit, to the memory device, a training command configured to identify a command-to-indication delay associated with the memory device.

Figure 8:
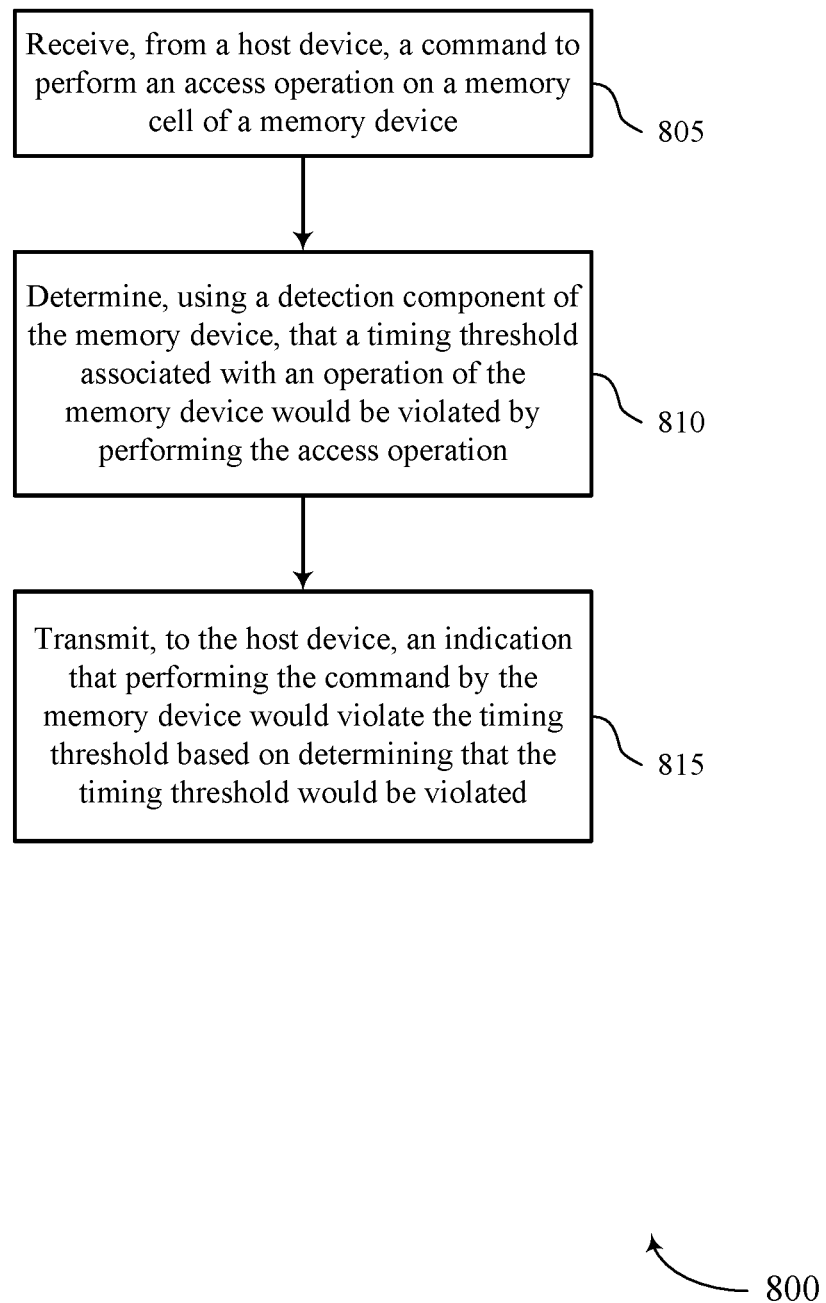
FIGS. 8 through 11 show flowcharts illustrating a method or methods that support detection of illegal commands in accordance with aspects as disclosed herein.

FIG. 8 shows a flowchart illustrating a method 800 that supports detection of illegal commands in accordance with aspects as disclosed herein. The operations of method 800 may be implemented by a controller or its components as described with reference to FIGS. 1 and 2. For example, the operations of method 800 may be performed by a controller (e.g., a device memory controller 155 or local memory controller 165) as described with reference to FIG. 6. In some examples, a controller may execute a set of instructions to control the functional elements of the controller to perform the functions described below. Additionally or alternatively, a controller may perform aspects of the functions described below using special-purpose hardware.

At 805, the controller may receive, from a host device, a command to perform an access operation on a memory cell of a memory device. The operations of 805 may be performed according to the methods described herein. In some examples, aspects of the operations of 805 may be performed by a command receiver 610 as described with reference to FIG. 6.

At 810, the controller may determine, using a detection component of the memory device, that a timing threshold associated with an operation of the memory device would be violated by performing the access operation. The operations of 810 may be performed according to the methods described herein. In some examples, aspects of the operations of 810 may be performed by a timing threshold determiner 615 as described with reference to FIG. 6.

At 815, the controller may transmit, to the host device, an indication that performing the command by the memory device would violate the timing threshold based on determining that the timing threshold would be violated. The operations of 815 may be performed according to the methods described herein. In some examples, aspects of the operations of 815 may be performed by an error indication transmitter 620 as described with reference to FIG. 6.

In some examples, an apparatus as described herein may perform a method or methods, such as the method 800. The apparatus may include features, means or instructions for receiving, from a host device, a command to perform an access operation on a memory cell of a memory device; determining, using a detection component of the memory device, that a timing threshold associated with an operation of the memory device would be violated by performing the access operation; and transmitting, to the host device, an indication that performing the command by the memory device would violate the timing threshold based at least in part on determining that the timing threshold would be violated.

Some examples of the method 800 and the apparatus described herein may further include operations, features, means, or instructions for refraining from executing the access operation based at least in part on determining that the timing threshold would be violated using the detection component, wherein transmitting the indication is based at least in part on refraining from executing the access operation.

Some examples of the method 800 and the apparatus described herein may further include operations, features, means, or instructions for identifying the command received from the host device after receiving the command; and selecting the timing threshold from a set of timing thresholds based at least in part on the command, wherein determining whether the timing threshold would be violated is based at least in part on selecting the timing threshold.

Some examples of the method 800 and the apparatus described herein may further include operations, features, means, or instructions for selecting a plurality of timing thresholds from the set of timing thresholds based at least in part on the command, wherein determining whether the timing threshold would be violated comprises determining whether at least one of the plurality of timing thresholds would be violated.

Some examples of the method 800 and the apparatus described herein may further include operations, features, means, or instructions for locking a bank associated with the memory cell to prevent additional operations being performed on the bank based at least in part on determining that the timing threshold would be violated, wherein the indication indicates that the bank is locked.

Some examples of the method 800 and the apparatus described herein may further include operations, features, means, or instructions for identifying that the memory device has completed a current access operation, wherein locking the bank occurs after the current access operation is complete.

Some examples of the method 800 and the apparatus described herein may further include operations, features, means, or instructions for receiving, from the host device, a message that includes information configured to unlock the bank to enable an additional operation to be performed on the bank based at least in part on transmitting the indication.

Some examples of the method 800 and the apparatus described herein may further include operations, features, means, or instructions for determining that the command is a training command, wherein receiving the command occurs during initialization of the memory device.

Some examples of the method 800 and the apparatus described herein may further include operations, features, means, or instructions for identifying a state of a bank associated with the memory cell based at least in part on receiving the command, wherein transmitting the indication to the host device is based at least in part on the state of the bank when the command is received.

In some examples of the method 800 and the apparatus described herein, the memory device comprises a bank having one or more rows of memory cells, wherein at least one of the one or more rows comprises the memory cell.

Some examples of the method 800 and the apparatus described herein may further include operations, features, means, or instructions for determining that a row of a bank of the memory device is open, the bank is precharging and a tRP has not elapsed, or a tRFC associated with a refresh command has not elapsed, or any combination thereof, wherein the command comprises a row activation command.

Some examples of the method 800 and the apparatus described herein may further include operations, features, means, or instructions for determining that no row of a bank of the memory device is open, a row of the bank is open and a tRAS has not elapsed, a tWR associated with a write command has not elapsed, a tRTP associated with a read command has not elapsed, or any combination thereof, wherein the command comprises a row precharge command.

Some examples of the method 800 and the apparatus described herein may further include operations, features, means, or instructions for determining that a bank of the memory device is idle or precharging, a row of the bank is open and a tRCDWR has not elapsed, a tCCD associated with a preceding write command has not elapsed, a tRTW associated with a preceding read command has not elapsed, or any combination thereof, wherein the command comprises a write command.

Some examples of the method 800 and the apparatus described herein may further include operations, features, means, or instructions for determining that a bank of the memory device of the is idle or precharging, the bank is open and a tRCDRD has not elapsed, a tCCD associated with a preceding read command has not elapsed, a tWTR associated with a preceding write command has not elapsed, or any combination thereof, wherein the command comprises a read command.

Some examples of the method 800 and the apparatus described herein may further include operations, features, means, or instructions for determining that a row of a bank of the memory device is open, the bank is precharging and a tRP has not elapsed, or any combination thereof, wherein the command comprises a refresh command.

Some examples of the method 800 and the apparatus described herein may further include operations, features, means, or instructions for refraining from executing the access operation based at least in part on determining that the timing threshold would be violated using the detection component, wherein transmitting the indication occurs after refraining from executing the access operation.

In some examples of the method 800 and the apparatus described herein, the command comprises a row activation command, a row precharge command, a write command, a read command, or a refresh command, or any combination thereof.

In some examples of the method 800 and the apparatus described herein, the timing threshold comprises a tRC, a tRAS, a tRCDRD, a tRCDWR, a tRTP, a tWR, a tRP, a tRFC, a tCCD, a tRTW, a tWTR, or any combination thereof.

In some examples of the method 800 and the apparatus described herein, the memory device comprises a DRAM memory device.

In some examples, an apparatus as described herein may perform a method or methods, such as the method 800. The apparatus may include features, means or instructions for receiving, from a host device, a command to perform an access operation on at least one memory cell of the bank; determining that a timing threshold associated with accessing the at least one memory cell would be violated by performing the access operation; and transmitting, to the host device, an error signal indicating that the command received from the host device cannot be performed by the memory device based at least in part on determining that the timing threshold would be violated.

Figure 9:
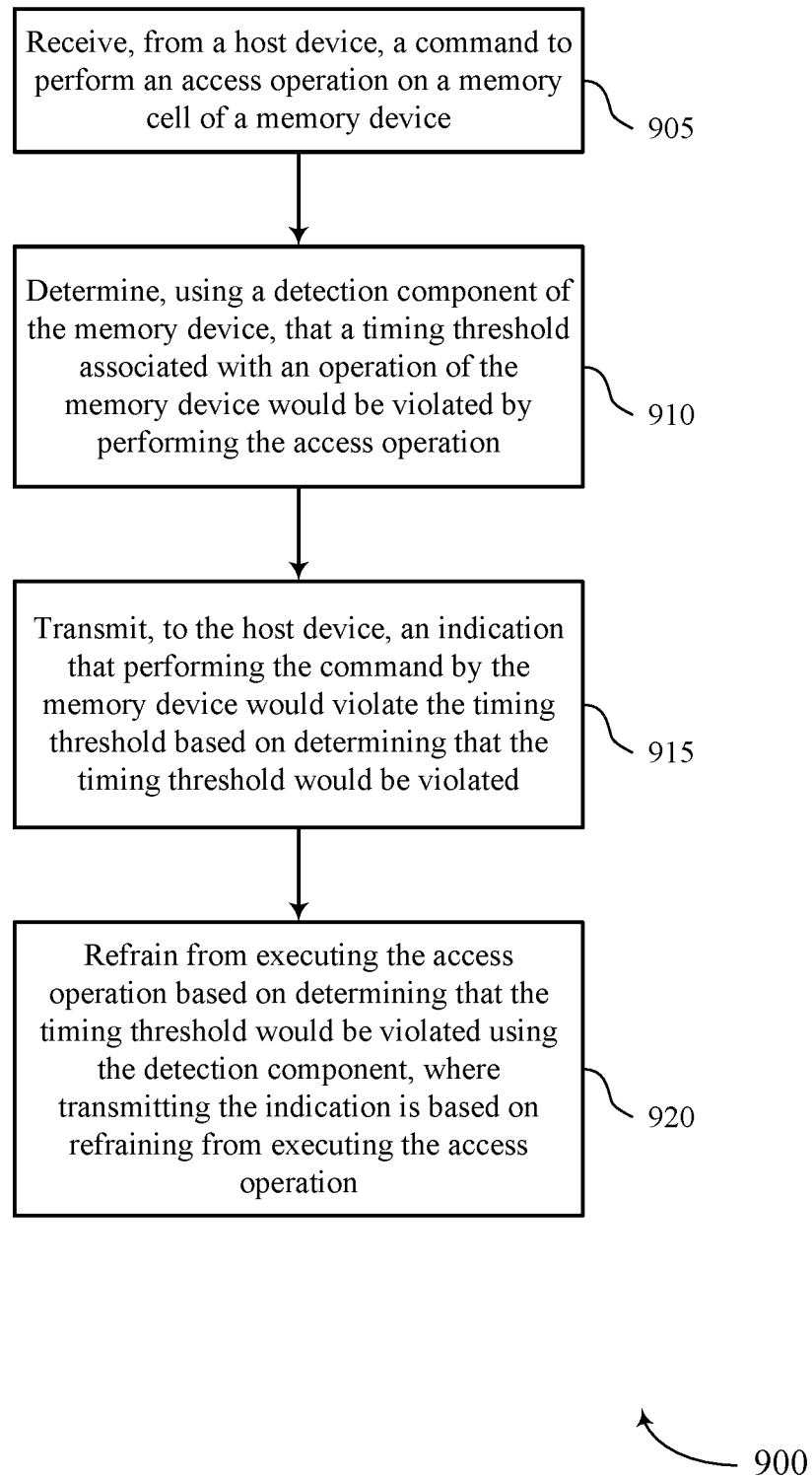

FIG. 9 shows a flowchart illustrating a method 900 that supports detection of illegal commands in accordance with aspects as disclosed herein. The operations of method 900 may be implemented by a controller or its components as described with reference to FIGS. 1 and 2. For example, the operations of method 900 may be performed by a controller (e.g., a device memory controller 155 or local memory controller 165) as described with reference to FIG. 6. In some examples, a controller may execute a set of instructions to control the functional elements of the controller to perform the functions described below. Additionally or alternatively, a controller may perform aspects of the functions described below using special-purpose hardware.

At 905, the controller may receive, from a host device, a command to perform an access operation on a memory cell of a memory device. The operations of 905 may be performed according to the methods described herein. In some examples, aspects of the operations of 905 may be performed by a command receiver 610 as described with reference to FIG. 6.

At 910, the controller may determine, using a detection component of the memory device, that a timing threshold associated with an operation of the memory device would be violated by performing the access operation. The operations of 910 may be performed according to the methods described herein. In some examples, aspects of the operations of 910 may be performed by a timing threshold determiner 615 as described with reference to FIG. 6.

At 915, the controller may transmit, to the host device, an indication that performing the command by the memory device would violate the timing threshold based on determining that the timing threshold would be violated. The operations of 915 may be performed according to the methods described herein. In some examples, aspects of the operations of 915 may be performed by an error indication transmitter 620 as described with reference to FIG. 6.

At 920, the controller may refrain from executing the access operation based on determining that the timing threshold would be violated using the detection component, where transmitting the indication is based on refraining from executing the access operation. The operations of 920 may be performed according to the methods described herein. In some examples, aspects of the operations of 920 may be performed by an operation component 625 as described with reference to FIG. 6.

Figure 10:
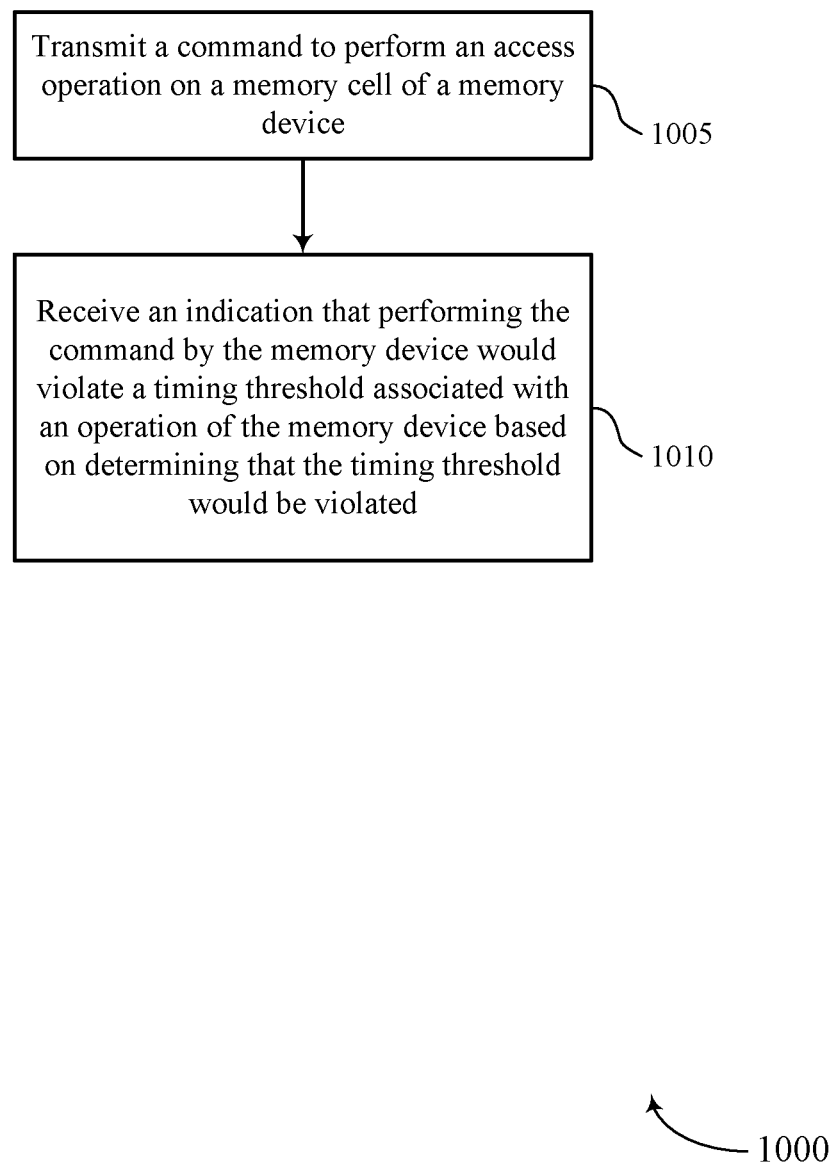

FIG. 10 shows a flowchart illustrating a method 1000 that supports detection of illegal commands in accordance with aspects as disclosed herein. The operations of method 1000 may be implemented by a host device (e.g., an external memory controller 105) or its components as described with reference to FIGS. 1 and 2. For example, the operations of method 1000 may be performed by a device (e.g., a host device) as described with reference to FIG. 7. In some examples, a device may execute a set of instructions to control the functional elements of the device to perform the functions described below. Additionally or alternatively, a device may perform aspects of the functions described below using special-purpose hardware.

At 1005, the host device may transmit a command to perform an access operation on a memory cell of a memory device. The operations of 1005 may be performed according to the methods described herein. In some examples, aspects of the operations of 1005 may be performed by a command transmitter 710 as described with reference to FIG. 7.

At 1010, the host device may receive an indication that performing the command by the memory device would violate a timing threshold associated with an operation of the memory device based on determining that the timing threshold would be violated. The operations of 1010 may be performed according to the methods described herein. In some examples, aspects of the operations of 1010 may be performed by an error indication receiver 715 as described with reference to FIG. 7.

In some examples, an apparatus as described herein may perform a method or methods, such as the method 1000. The apparatus may include features, means or instructions for transmitting, from a host device, a command to perform an access operation on a memory cell of a memory device; and receiving, by the host device, an indication that performing the command by the memory device would violate a timing threshold associated with an operation of the memory device based at least in part on determining that the timing threshold would be violated.

Some examples of the method 1000 and the apparatus described herein may further include operations, features, means, or instructions for identifying the command from a plurality of commands sent from the host device that would violate the timing threshold based at least in part on receiving the indication.

Some examples of the method 1000 and the apparatus described herein may further include operations, features, means, or instructions for identifying a command-to-indication delay associated with a duration between when the host device transmits the command and receives the indication, wherein identifying the command associated with the indication is based at least in part on identifying the command-to-indication delay.

Some examples of the method 1000 and the apparatus described herein may further include operations, features, means, or instructions for transmitting, to the memory device, a training command configured to identify a command-to-indication delay associated with the memory device; receiving, from the memory device, an error signal based at least in part on transmitting the training command; and identifying a command-to-indication delay associated with a duration between when the host device transmits the command and receives the indication based at least in part a difference between a first time that the training command is transmitted and a second time the error signal is received, wherein identifying the command associated with the indication is based at least in part on identifying the command-to-indication delay.

Some examples of the method 1000 and the apparatus described herein may further include operations, features, means, or instructions for storing the command-to-error delay to use when identifying the command associated with the indication.

Some examples of the method 1000 and the apparatus described herein may further include operations, features, means, or instructions for re-sending, by the host device, the command to the memory device based at least in part on receiving the indication.

Figure 11:
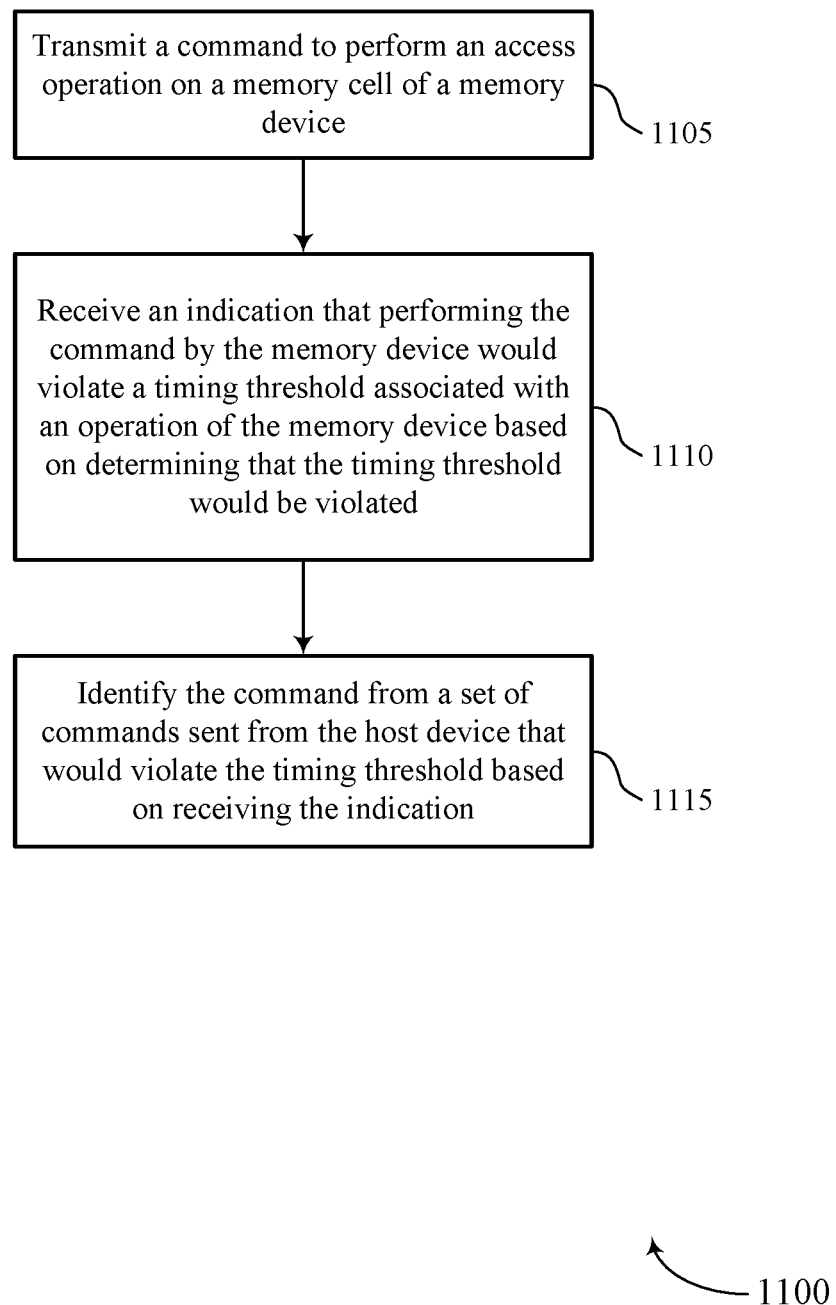

FIG. 11 shows a flowchart illustrating a method 1100 that supports detection of illegal commands in accordance with aspects as disclosed herein. The operations of method 1100 may be implemented by a host device (e.g., an external memory controller 105) or its components as described with reference to FIGS. 1 and 2. For example, the operations of method 1100 may be performed by a device (e.g., a host device) as described with reference to FIG. 7. In some examples, a device may execute a set of instructions to control the functional elements of the device to perform the functions described below. Additionally or alternatively, a device may perform aspects of the functions described below using special-purpose hardware.

At 1105, the host device may transmit a command to perform an access operation on a memory cell of a memory device. The operations of 1105 may be performed according to the methods described herein. In some examples, aspects of the operations of 1105 may be performed by a command transmitter 710 as described with reference to FIG. 7.

At 1110, the host device may receive an indication that performing the command by the memory device would violate a timing threshold associated with an operation of the memory device based on determining that the timing threshold would be violated. The operations of 1110 may be performed according to the methods described herein. In some examples, aspects of the operations of 1110 may be performed by an error indication receiver 715 as described with reference to FIG. 7.

At 1115, the host device may identify the command from a set of commands sent from the host device that would violate the timing threshold based on receiving the indication. The operations of 1115 may be performed according to the methods described herein. In some examples, aspects of the operations of 1115 may be performed by a command identifier 720 as described with reference to FIG. 7.

An apparatus is described. In some examples, the apparatus may include an array of memory cells comprising one or more storage components, a command decoder configured to receive, from a host device, a command to perform an access operation on a memory cell of the array of memory cells, a detection component configured to determine whether a timing threshold associated with the memory cell would be violated by performing the access operation and a transmitter configured to transmit an indication that performing the command would violate the timing threshold based at least in part on determining that the timing threshold would be violated using the detection component.

In some examples, the apparatus may include a selection component configured to select the timing threshold from a set of timing thresholds based at least in part on a type of the command received from the host device, wherein the detection component is configured determine whether the timing threshold would be violated is based at least in part on the selection component selecting the timing threshold. In some examples, the detection component may include one or more analog timers, one or more digital counters, or any combination thereof configured to output one or more timings associated with operation of the array of memory cells, wherein the detection component is configured to compare at least one timing of the one or more timings associated with the operation of the array of memory cells with a type of the command. In some examples, the detection component is further configured to cause the array of memory cells to refrain from executing the access operation based at least in part on the comparison of the at least one timing associated with the operation of the array of memory cells with the type of the command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain, and the unexposed regions may be removed.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving, at a memory device, a first command for determining a timing parameter associated with communications between a host device and the memory device;
    refraining from locking a bank associated with one or more memory cells of the memory device based at least in part on receiving the first command;
    transmitting first signaling to the host device based at least in part on refraining from locking the bank associated with the one or more memory cells, wherein the first signaling comprises an indication of an error; and
    receiving, at the memory device based at least in part on transmitting the first signaling, a second command to perform an access operation on the one or more memory cells of the memory device.

2. The method of claim 1, wherein:
    a first bit of the first command comprises a first value that indicates the first command is a training command; and
    a first bit of the second command comprises a second value that indicates the second command is an access command.

3. The method of claim 2, further comprising:
    determining that the first command comprises the training command based at least in part on the first value of the first bit, wherein refraining from locking the bank associated with the one or more memory cells is based at least in part on determining that the first command comprises the training command.

4. The method of claim 1, further comprising:
    transmitting, to the host device prior to transmitting the first signaling, second signaling, wherein the second signaling comprises a first waveform with a first shape.

5. The method of claim 4, wherein an amplitude of the first signaling is constant while transmitting the first signaling.

6. The method of claim 4, wherein transmitting the first signaling comprises:
    transmitting a second waveform with a second shape different than the first shape, wherein the second shape is inverted relative to the first shape.

7. The method of claim 1, wherein receiving the first command comprises:
    receiving the first command as part of an initialization operation for powering on the memory device.

8. The method of claim 1, further comprising:
    determining that a timing threshold associated with an operation of the memory device would be violated by performing the access operation; and
    transmitting, to the host device, third signaling indicating that performing the access operation would violate the timing threshold.

9. The method of claim 8, further comprising:
    refraining from performing the access operation based at least in part on determining that the timing threshold would be violated, wherein transmitting the third signaling is based at least in part on refraining from executing the access operation.

10. The method of claim 8, further comprising:
selecting the timing threshold from a set of timing thresholds based at least in part on receiving the second command, wherein determining whether the timing threshold would be violated is based at least in part on selecting the timing threshold.

11. The method of claim 10, wherein selecting the timing threshold comprises:
selecting one or more timing thresholds from the set of timing thresholds based at least in part on receiving the second command, wherein determining whether the timing threshold would be violated comprises determining whether at least one of the one or more timing thresholds would be violated.

12. The method of claim 8, further comprising:
locking the bank associated with the one or more memory cells to prevent additional operations from being performed on the bank based at least in part on determining that the timing threshold would be violated, wherein the third signaling indicates that the bank is locked.

13. A method, comprising:
transmitting, at a host device, a first command for determining a timing parameter associated with communications between the host device and a memory device;
receiving first signaling from the memory device based at least in part on transmitting the first command, wherein the first signaling comprises an indication of an error;
determining the timing parameter based at least in part on transmitting the first command and receiving the first signaling, wherein the timing parameter comprises a duration between the host device transmitting the first command and receiving the first signaling; and
transmitting, at the host device, a second command to perform an access operation on one or more memory cells of the memory device.

14. The method of claim 13, wherein:
a first bit of the first command comprises a first value that indicates the first command is a training command; and
a first bit of the second command comprises a second value that indicates the second command is an access command.

15. The method of claim 13, further comprising:
receiving, from the memory device, prior to receiving the first signaling, second signaling comprising a first waveform with a first shape.

16. The method of claim 15, wherein an amplitude of the first signaling is constant.

17. The method of claim 15, wherein receiving the first signaling comprises:
receiving a second waveform with a second shape different than the first shape, wherein the second shape is inverted relative to the first shape.

18. The method of claim 13, wherein transmitting the first command comprises:
transmitting the first command as part on an initialization operation for powering on the memory device.

19. The method of claim 13, further comprising:
receiving, from the memory device, third signaling indicating that performing the access operation would violate a timing threshold associated with the memory device.

20. An apparatus, comprising:
a controller associated with a memory device, wherein the controller is configured to cause the apparatus to:
receive a first command for determining a timing parameter associated with communications between a host device and the memory device;
refrain from locking a bank associated with one or more memory cells of the memory device based at least in part on receiving the first command;
transmit first signaling based at least in part on refraining from locking the bank associated with the one or more memory cells, wherein the first signaling comprises an indication of an error; and
receive a second command to perform an access operation on the one or more memory cells of the memory device.

* * * * *